United States Patent
Mitarashi

(10) Patent No.: US 6,473,359 B1
(45) Date of Patent: Oct. 29, 2002

(54) SEMICONDUCTOR INTEGRATED CIRCUIT

(75) Inventor: Mutsumi Mitarashi, Tokyo (JP)

(73) Assignee: Oki Electric Industry Co, Ltd., Tokyo (JP)

( * ) Notice: Subject to any disclaimer, the term of this patent is extended or adjusted under 35 U.S.C. 154(b) by 0 days.

(21) Appl. No.: 09/722,043

(22) Filed: Nov. 27, 2000

Related U.S. Application Data

(63) Continuation of application No. 09/219,488, filed on Dec. 23, 1998, now abandoned.

(30) Foreign Application Priority Data

Aug. 18, 1998 (JP) .......................................... 10-231755

(51) Int. Cl.⁷ ................................................ G11C 8/00
(52) U.S. Cl. .............. 365/233; 365/230.06; 365/189.05
(58) Field of Search ............................ 365/233, 230.06, 365/49, 189.05; 341/144

(56) References Cited

U.S. PATENT DOCUMENTS

| | | | |
|---|---|---|---|
| 4,423,493 A | * 12/1983 | Annecke ...................... 365/233 |
| 5,717,623 A | * 2/1998 | Hughes et al. .......... 365/233 X |
| 5,838,271 A | * 11/1998 | Park ............................. 341/144 |
| 5,844,515 A | * 12/1998 | Park ............................. 341/144 |

FOREIGN PATENT DOCUMENTS

JP 02-055421 * 8/1988

OTHER PUBLICATIONS

Jean Michel Fournier and Patrice Senn A 130–MHz 8–b CMOS Video DAC for HDTV Applications, *IEEE Journal of Solid–State Circuits*, pp. 1073–1077, vol.26, No. 7, Jul. 1991.*

* cited by examiner

*Primary Examiner*—Huan Hoang
(74) *Attorney, Agent, or Firm*—Rabin & Berdo, P.C.

(57) ABSTRACT

A D/A converter is provided with an equal current cell matrix achieved by arraying in a matrix equal current cells each having a current switch portion, a row decoder that makes selections in the direction of the rows in the equal current cell matrix and a column decoder that makes selections in the direction of the columns in the equal current cell matrix. The D/A converter is characterized in that the equal current cells are each provided with a latch circuit for achieving synchronization of an output signal from the row decoder and an output signal from the column decoder that are input to the current switch portion. Since the current is switched by the latch circuit, glitches can be completely eliminated from the signals input to the current switch portion by taking into consideration the lengths of delays at the row decoder and the column decoder and the timing of the clock to achieve an improvement in the S/N ratio. Furthermore, since no NMOS capacitance is required, the power consumption is reduced.

12 Claims, 7 Drawing Sheets

FIG. 9

PRIOR ART

| A5 | A4 | A3 | D0 | D1 | D2 | D3 | D4 | D5 | D6 |
|----|----|----|----|----|----|----|----|----|----|
| 0 | 0 | 0 | 0 | 0 | 0 | 0 | 0 | 0 | 0 |
| 0 | 0 | 1 | 1 | 0 | 0 | 0 | 0 | 0 | 0 |
| 0 | 1 | 0 | 1 | 1 | 0 | 0 | 0 | 0 | 0 |
| 0 | 1 | 1 | 1 | 1 | 1 | 0 | 0 | 0 | 0 |
| 1 | 0 | 0 | 1 | 1 | 1 | 1 | 0 | 0 | 0 |
| 1 | 0 | 1 | 1 | 1 | 1 | 1 | 1 | 0 | 0 |
| 1 | 1 | 0 | 1 | 1 | 1 | 1 | 1 | 1 | 0 |
| 1 | 1 | 1 | 1 | 1 | 1 | 1 | 1 | 1 | 1 |

US 6,473,359 B1

SEMICONDUCTOR INTEGRATED CIRCUIT

This is a Continuation of application Ser. No. 09/219,488, filed Dec. 23, 1998, now abandoned.

BACKGROUND OF THE INVENTION

The present invention relates to a semiconductor integrated circuit and more specifically it relates to a semiconductor integrated circuit that performs digital/analog D/A conversion.

Current cell circuits that achieve output currents that are equal or exponentials of 2, are employed in a digital/analog converter (hereafter referred to as a D/A converter) and the like. An example of a D/A converter employing equal current cell circuits in the prior art is explained below with reference to FIG. 7.

As illustrated in FIG. 7, a D/A converter 400 comprises equal current cell circuits 450 arrayed in a matrix, a row decoder 410 and a first latch circuit 430 that make selections in the direction of the rows of the matrix of the equal current cell circuits 450, a column decoder 420 and a second latch circuit 440 that make selections in the direction of the columns of the matrix of the equal current cell circuits 450.

As shown in FIG. 7, the three high order bits of an input A (5:0), i.e., A5, A4 and A3, are input to the row decoder 410, and seven-bit data (the individual bits are indicated with reference numbers D0–D6) are output to the first latch circuit 430. In the row decoder 410, specific logic elements are provided in correspondence to the individual sets of data D0–D6 so that the truth table illustrated in FIG. 9 is achieved. In addition, the three low order bits of the input A (5:0), i.e., A2, A1 and A0 are input to the column decoder 420, and seven-bit data are output to the second latch circuit 440 in a similar manner.

Now, the structure of the row decoder 410 and its relationship with its output, i.e., the individual sets of data D0–D6, are explained. Since the structure of the column decoder 420 is essentially identical to that of the row decoder 410, its explanation is omitted.

The data D0 are the output of a three-input NAND element NAND0 into which inverted signals of A5, A4 and A3 are input. The data D1 are the output of a two-input NAND element NAND1 into which inverted signals of A5 and A4 are input. The data D2 are the output of a two-input NAND element NAND2 into which the output of a two-input OR element OR2 into which inverted signals of A4 and A3 are input and an inverted signal of A5 are input. The data D3 are the output of an inverter element INV5 into which an inverted signal of A5 is input. The data D4 are the output of a two-input NOR element NOR4 into which the output of a two-input AND element AND4 into which inverted signals of A4 an A3 are input and an inverted signal of A5 are input. The data D5 are the output of a two-input NOR element NOR5 into which inverted signals of A5 and A4 are input. The data D6 are the output of a three-input NOR element NOR6 into which inverted signals of A5, A4 and A3 are input. The row decoder 410 structured as described above achieves the truth Table shown in FIG. 9.

The first latch circuit 430 latches the output of the row decoder 410 in synchronization with a clock CLK. The output of the first latch circuit 430 is input to the equal current cells 450, to be detailed later, as inputs i and i+1. Likewise, the second latch circuit 440 latches the output from the column decoder 420 in synchronization with the clock CLK. The output of the second latch circuit 440 is input to the equal current cells 450, to be detailed later, as an input j.

The equal current cells 450, which are provided in an 8×8 matrix as illustrated in FIG. 7, are connected to the first latch circuit 430 and the second latch circuit 440. The inputs i and i+1 connected to the first latch circuit 430 and the input j connected to the second latch circuit 440 are input to the equal current cells 450.

An output Qm (m represents an integer equal to or greater than 0 and equal to or less than 6) of the first latch circuit 430 is input to the individual equal current cells in row m+2 as the input i and also is input to the individual equal current cells in row m+1 as the input i +1. The input i in the first row that is not connected to the first latch circuit 430 is instead connected to a source Vdd, and likewise, the input i+1 in the eighth row that is not connected to the first latch circuit 430 is instead connected to the ground GND.

An output Qn (n represents an integer equal to or greater than 0 and equal to or less than 6) of the second latch circuit 440 is input to the individual equal current cells in row n as the input j. The input j in the seventh row that is not connected to the second latch circuit 440 is instead connected to the ground GND.

Now, the circuit structure of the equal current cells 450 is explained in reference to FIG. 8. The input i is input to one input of a NAND element 452 via inverter elements 456 and 457. The output of the inverter element 456 is connected to the gate terminal of an NMOS capacitor N1. The input i+1 and the input j are input to a two-input OR element 451. The output of the two-input OR element 451 is input to another input of the NAND element 452. The output of the NAND element 452 is connected to the gate terminal of an NMOS capacitor N2 and is also input to a current switch portion 459 which is to be detailed later.

Next, the structure of the current switch portion 459 in each equal current cell 450 is explained. A PMOS Q3, which is set in a drain saturation region by a bias voltage, functions as a constant current source. PMOS's Q1 and Q2 constituting the current switch portion 459 are turned ON/OFF by a selection signal SEL which is an output from the two-input NAND element 452. The selection signal SEL is connected to the gate terminal of the PMOS Q1 via an inverter element 455 and an inverter element 454, and is also connected to the gate terminal of the PMOS Q2 via the inverter element 455.

When the selection signal SEL is 0, the PMOS Q1 is set to ON and the PMOS Q2 is set to OFF, whereas when the selection signal SEL is at 1, the PMOS Q1 is set to OFF and the PMOS Q2 is set to ON. In addition, when the selection signal SEL shifts either from 0 to 1 or from 1 to 0, the PMOS's Q1 and Q2 are set to OFF or ON together. When the PMOS's Q1 and Q2 are set to ON or OFF together, the drain voltage at the PMOS Q3 fluctuates to result in a fluctuation in the current in the output out due to charging/discharging of the incidental capacitance Cp to generate noise, which, in turn, affects the length of time required for settling.

When the PMOS Q1 is set to ON, the source Vdd is output as the output out via the PMOS Q1. When the PMOS Q2 is set to ON, on the other hand, the source Vdd is output as an output out b via the PMOS Q2. Both the outputs out and out b are wired throughout the matrix.

As an example, the operation of the equal current cells 450 that is performed when "011010" is input to the input A (5:0). The input A (5:0) is divided into 3-bit groups to be respectively input to the row decoder 410 and the column decoder 420. The row decoder 410 and the column decoder 420 have the same logic and achieve the truth table shown in FIG. 9. When "011" representing the high order three bits of the input is input to the row decoder 410, it outputs "1110000" as indicated in the truth table in FIG. 9. Likewise, when "010" representing the low order bits of the input is input to the column decoder 420, it outputs "1100000" as indicated in the truth table in FIG. 9.

The first latch circuit 430 and the second latch circuit 440 output their inputs in synchronization with the clock CLK. In the first row in the matrix of the equal current cells 450, since the inputs i and i+1 of the equal current cells 450 are at high level, the current is switched toward the out. The same applies to the second row and the third row.

Since the i input is at high level and the i+1 input is at low level in the fourth row, the output in the fourth row is determined by the j input. With the output of the second latch circuit 440 being "1100000", the j input is set to 1 in the first column and the second column resulting in the current being switched toward the out. The current is switched toward the out b in the third column and subsequent columns in the fourth row.

Since the i input is set to low level in the fifth and subsequent rows, the current is switched toward the out b. As a result, the current corresponding to the 24 cells in the first through third rows and the current corresponding to the two cells in the first column and the second column in the fourth row flows toward the out. In other words, the current corresponding to 011010 (binary number)=26 flows toward the out.

Now, there is a problem with the D/A converter 400 in that, since the switch timing for the equal current cell is adjusted by employing the NMOS capacitors N1 and N2 to prevent glitches, power consumption increases as the load capacity increases.

In addition, it is difficult to match the timing for the inputs i and i+1 and the input j, and thus, due to inconsistency and the like occurring during production, glitches cannot be completely eliminated. This, in turn, results in problems such as degradation of the S/N (signal-to-noise) ratio and a great length of time required for settling.

SUMMARY OF THE INVENTION

An object of the present invention, which has been completed by addressing the problems of the semiconductor integrated circuit in the prior art discussed above, is to provide a new and improved semiconductor integrated circuit with which a reduction in the power consumption is achieved.

Another object of the present invention is to provide a new and improved semiconductor integrated circuit with which the S/N ratio can be improved.

In order to achieve the objects described above, a semiconductor integrated circuit comprising an equal current cell matrix achieved by arranging, in a matrix, equal current cells each having a current switch portion provided with a current source; a first decoder circuit that selects in the direction of the rows in the equal current cell matrix, a specific number of equal current cells; and a second decoder circuit that selects, in the direction of the columns in the equal current cell matrix, a specific number of equal current cells, wherein the equal current cells are each provided with a storage circuit that outputs a specific output signal to the current switch portion by synchronizing an output signal from the first decoder and an output signal from the second decoder, is provided.

Through this structure, since the storage circuit is provided in each equal current cell to switch the current, glitches can be completely eliminated from the signal output to the current switch portion by taking into consideration the delays at the first decoder and the second decoder and the timing of the clock to achieve an advantage of an improved S/N ratio. Furthermore, since no NMOS capacitance is required, the power consumption can be reduced.

Alternatively, the storage circuit may include a latch circuit that outputs a signal in synchronism with a clock signal. This structure will reduce the number of gates in comparison to a structure in which a flip-flop is employed to constitute the storage circuit to thereby further reduce the chip area.

As an alternative, the equal current cell circuits may each include a waveform shaping circuit for shaping the potential waveform of the output signal from the storage circuit at a rear stage relative to the storage circuit. By adopting this structure, if, for instance, transistors are provided at the current switch portion, the potential at which the output waveforms cross can be set to ensure that current flows through the transistors constituting the current switch portion by using the waveform shaping circuit and, therefore, an improvement in the S/N ratio can be achieved.

Furthermore, the waveform shaping circuit may include an S-R latch circuit including two-input NOR elements. In this structure, since the inverter and the S-R latch circuit are employed to ensure that one of the outputs of the waveform shaping circuit falls before the other output rises, the potential at which the output waveforms cross can be set at almost equal levels at the rise and the fall of the input waveform and as a result, since the crossing potential can be set simply by adjusting the delay times at the individual gates, design is facilitated in addition to the advantages described above.

It is even more desirable to provide a plurality of inverter elements having different threshold voltage values at the waveform shaping circuit. By adopting this structure, since the potential at which the output waveforms cross can be set by one inverter and two inverters to ensure that current flows to the PMOS constituting the current switch portion, an advantage is achieved in that an improvement in the S/N ratio is realized as in the second embodiment. In addition, being constituted with, for instance, three inverters, the number of gates can be reduced to achieve a reduction in chip area.

BRIEF DESCRIPTION OF THE DRAWINGS

The above and other features of the invention and the concomitant advantages will be better understood and appreciated by person skilled in the field to which the invention pertains in view of the following description given in conjunction with the accompanying drawings which illustrate preferred embodiments.

FIG. 9 presents the truth values at the decoders.

DETAILED DESCRIPTION OF THE PREFERRED EMBODIMENTS

The following is a detailed explanation of the preferred embodiments of the semiconductor integrated circuit according to the present invention in reference to the attached drawings. It is to be noted that in this specification and the attached drawings, the same reference numbers are assigned to components having essentially identical functions and structural features to preclude the necessity for repeated explanation thereof.

First Embodiment

Figure 1:
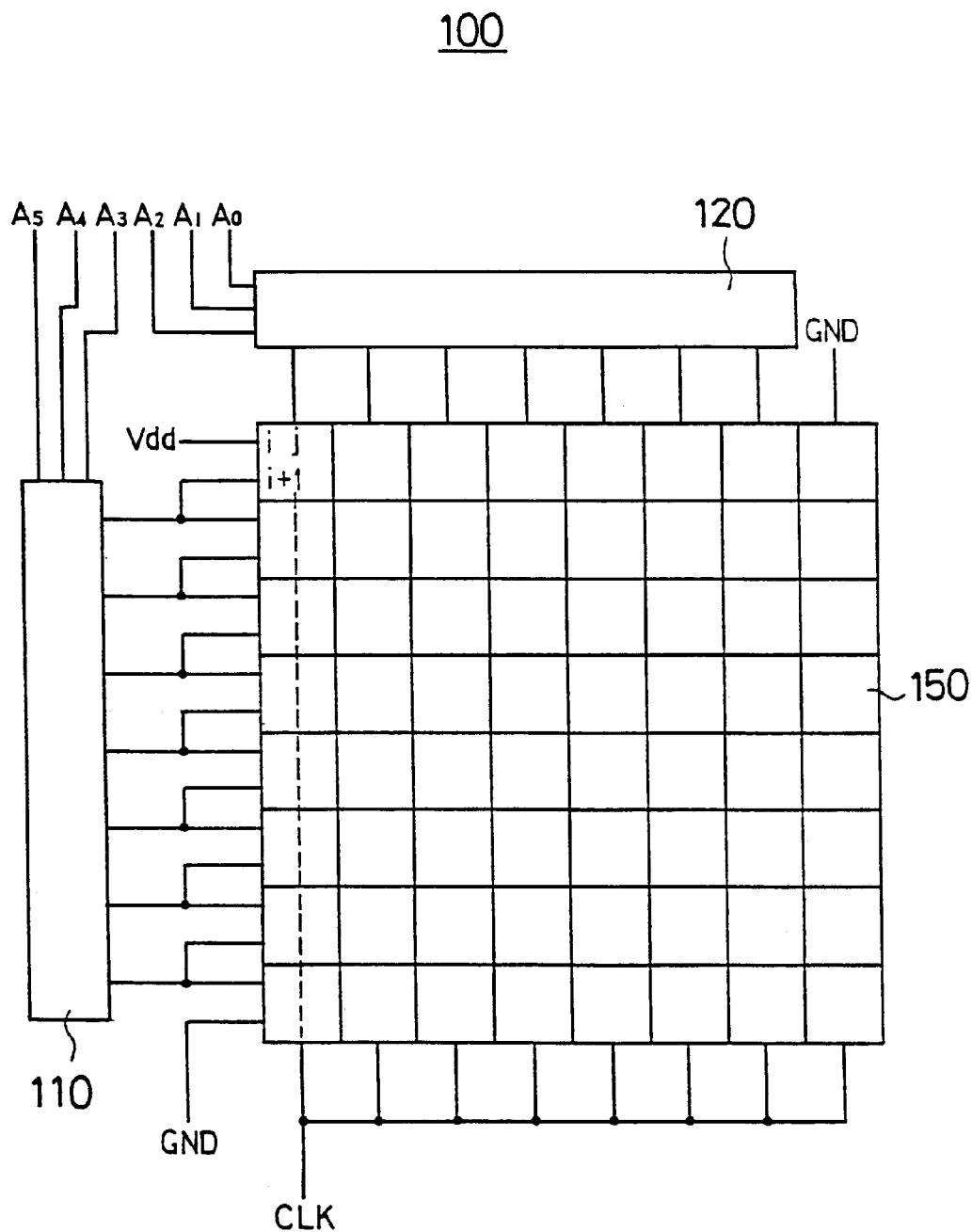
FIG. 1 illustrates the structure of the equal current cell matrix.
Figure 2:
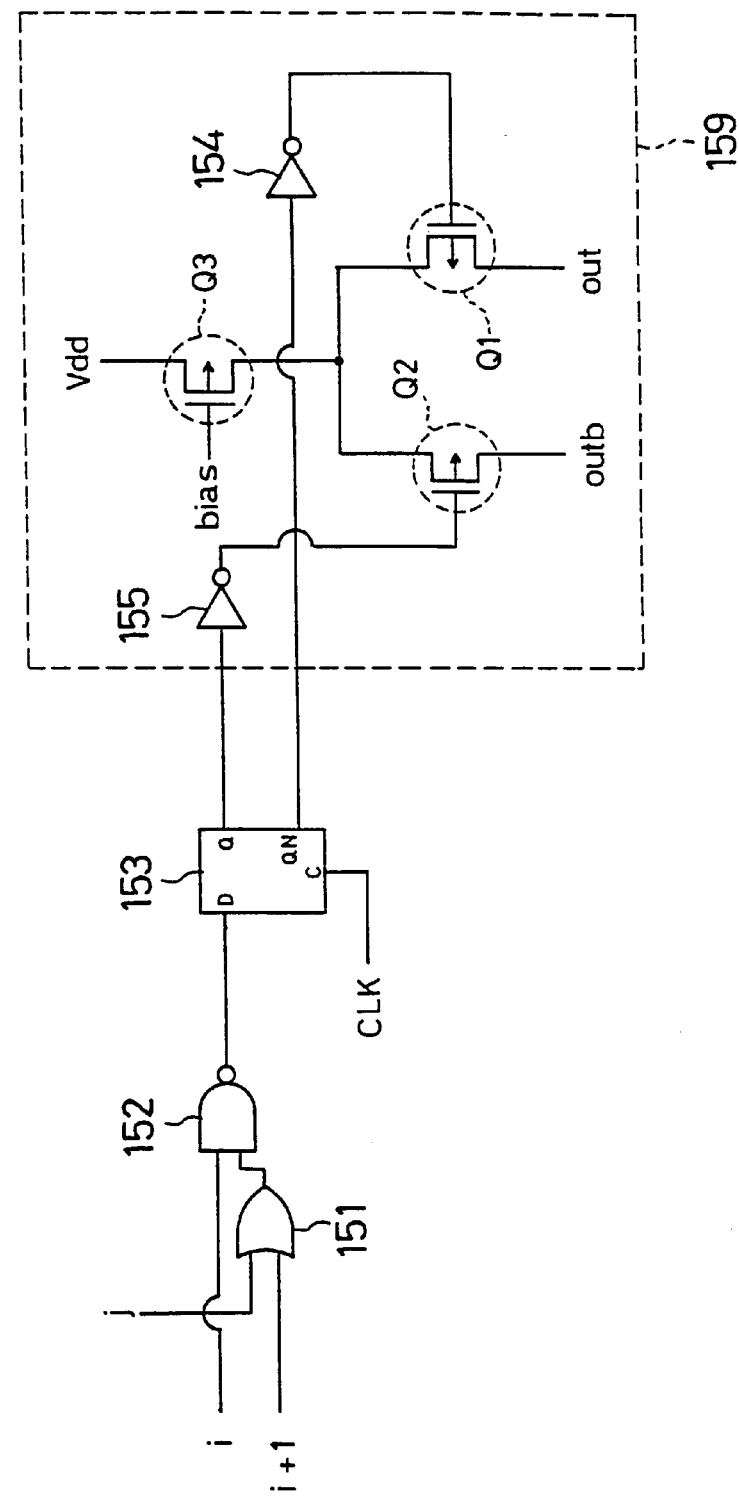
FIG. 2 illustrates the structure of the equal current cells in a first embodiment of the present invention.

A D/A converter 100 in the first embodiment is explained in reference to FIGS. 1 and 2. As illustrated in FIG. 1, the D/A converter 100 comprises equal current cell circuits 150 arrayed in a matrix, a row decoder 110 that makes selections in the direction of the rows of the equal current cell circuits 150 and a column decoder 120 that makes selections in the direction of the columns of the equal current cell circuits 150.

As illustrated in FIG. 1, the high order three bits of an input A (5:0), i.e., A5, A4 and A3, are input to the row decoder 110 which then outputs seven-bit data (the individual bits are indicated with reference numbers D0–D6 to the individual equal current cells 150 in the individual rows. The low order three bits of the input A (5:0), i.e., A2, A1 and A0, are input to the column decoder 120 which outputs seven-bit data to the individual equal current cells 150 in the individual columns in a similar manner.

Since the structure of the row decoder 110 is essentially identical to the structure of the row decoder 410 constituting the D/A converter 400 in the prior art described earlier, its explanation is omitted. The structure of the column decoder 120, too, is essentially identical to the structure of the column decoder 410*[2] constituting the D/A inverter 400. Thus, the row decoder 110 and the column decoder 120 both achieve the truth table illustrated in FIG. 9.

The equal current cells 150, which are arrayed in an 8×8 matrix as illustrated in FIG. 1, are connected to the row decoder 110 and the column decoder 120. Inputs i and i+1 connected to the row decoder 110 and an input j connected to the column decoder 120 are input to the equal current cells 150.

Now the circuit structure of an equal current cell 150 is explained in reference to FIG. 2. The equal current cell 150 includes a two-input OR element 151 into which the inputs i+1 and j are input, a two-input NAND element 152 into which the output from the two-input OR element 151 and the input i are input, a latch circuit 153 into which the output from the two-input NAND element 152 and a clock CLK are input and a current switch portion 159.

An output Q and an output QN of the latch circuit 153 are input to the current switch portion 159. The logic level at the output QN of the latch circuit 153 is achieved by inverting the logic level of the output Q. The current switch portion 159 includes inverter elements 154 and 155 and P-channel type MOS transistors (hereafter referred to as PMOS) Q1, Q2 and Q3. The output QN of the latch circuit 153 is connected,to then gate terminal of the PMOS Q1 via the inverter element 154. The output Q of the latch circuit 153 is connected to the gate terminal of the PMOS Q2 via the inverter element 155.

The PMOS Q3, with a bias voltage applied to its gate terminal, is set in a drain saturation region to function as a constant current source I1. The source terminal of the PMOS Q3 is connected to a source Vdd while the drain terminal of the PMOS Q3 is connected to the source terminals of the said PMOS's Q1 and Q2. The drain terminal of the PMOS Q1 is connected to an output "out", whereas the drain terminal of the PMOS Q2 is connected to an output "out b". The outputs out and "out b" are both wired throughout the matrix.

Figure 7:
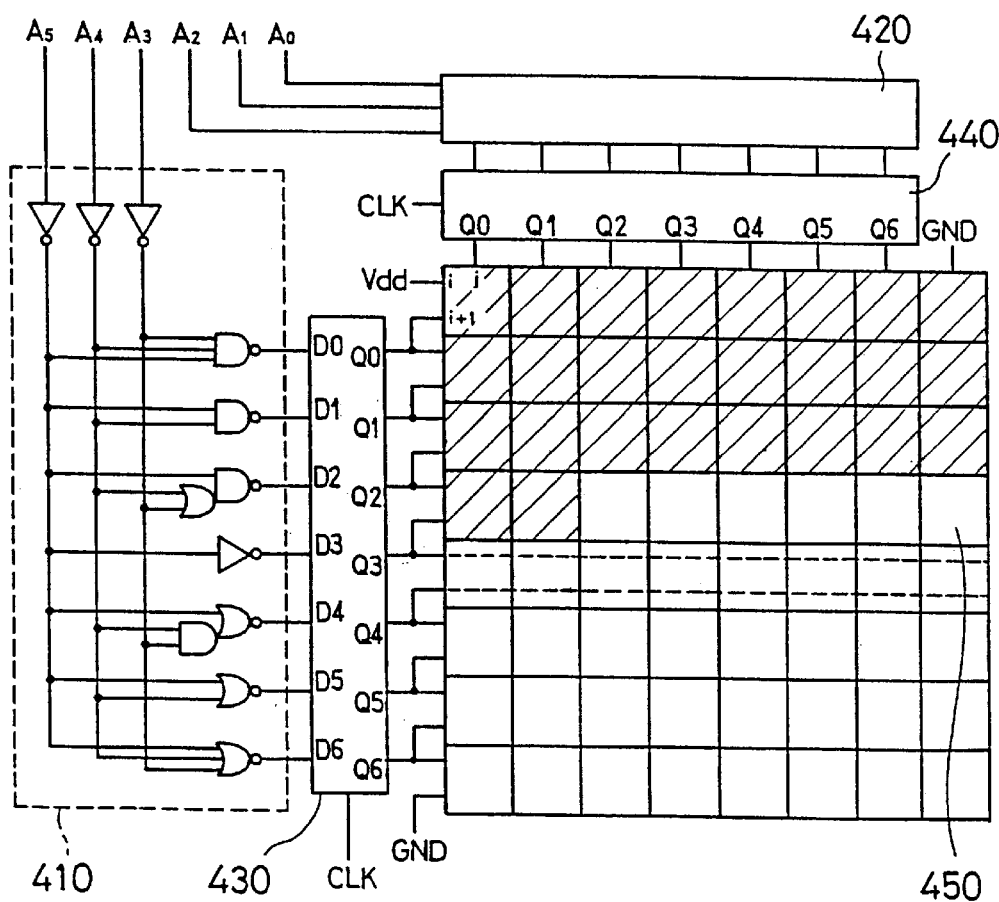
FIG. 7 illustrates the structure of an equal current cell matrix in the prior art.
Figure 8:
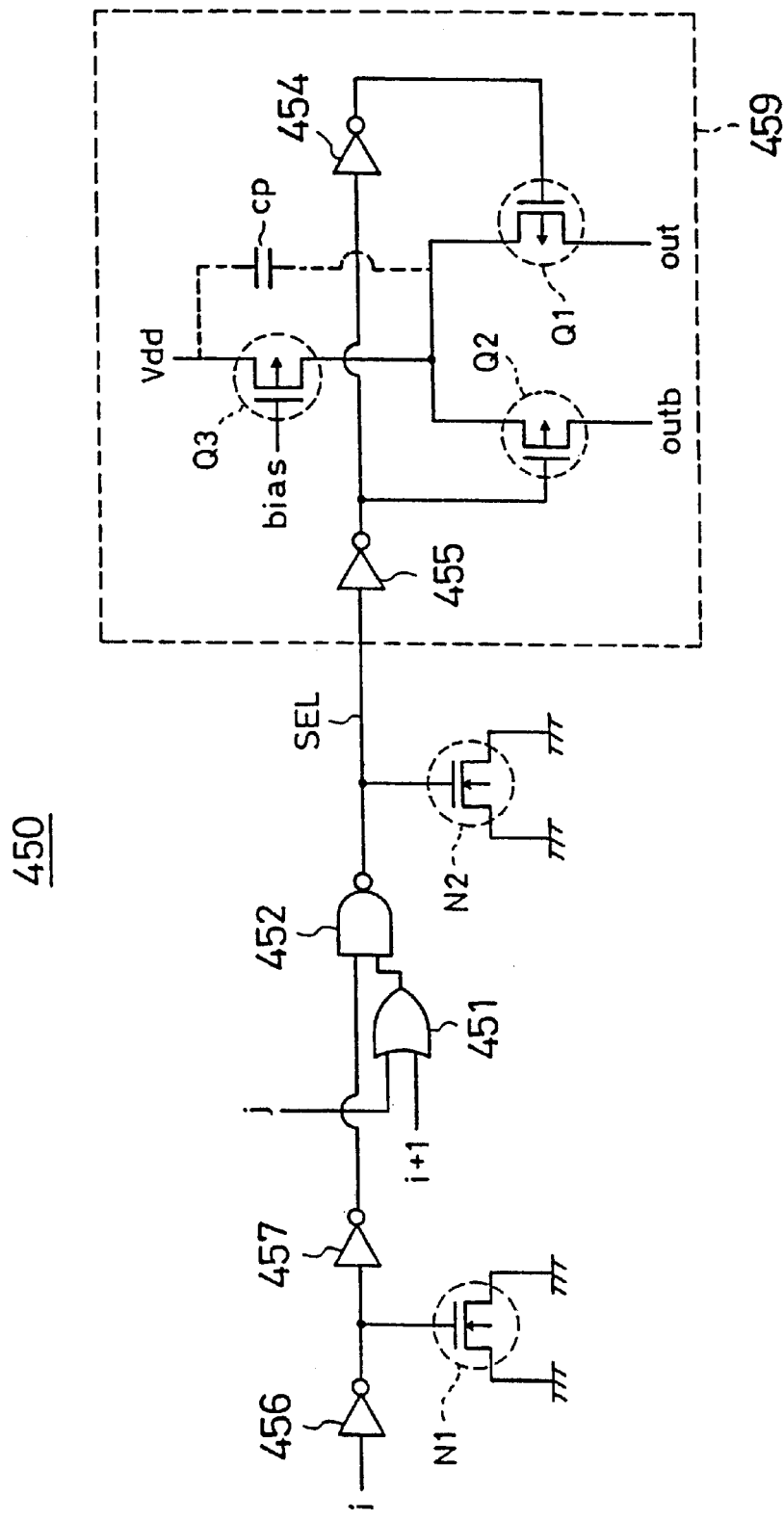
FIG. 8 illustrates the structure of an equal current cell in the prior art.

As explained above, the equal current cell 150 in the D/A converter 100 in this embodiment is characterized in its structure achieved by incorporating the functions of the first latch circuit 430 and the second latch circuit 440 in the D/A converter 400 in the prior art illustrated in FIG. 7 within the equal current cell 150.

The following is an explanation of the operation of the D/A converter, 100 structured as described above. Since the operations performed by the row decoder 110 and the column decoder 120 are essentially identical to the operations performed by the row decoder 410 and the column decoder 420 in the D/A converter 400 in the prior art, their explanation is omitted.

When the input i to an equal current cell 150 is at high level and either the input i+1 or j is set to high level, the output of the two-input NAND element 152 is set to low level. When the output of the two-input NAND element 152 is at low level, the PMOS Q1 is turned on and the PMOS Q2 is turned off with the output QN indicating high level output in synchronization with the clock CLK input to the latch circuit 153. As a result, the current from the constant current source I1 is supplied to the output "out".

When the input i to an equal current cell 150 is at low level or when both the inputs i+1 and j shift to low level, the output of the two-input NAND element 152 is set to high level. When the output of the two-input NAND element 152 is at high level, the PMOS Q2 is turned on and the PMOS Q1 is turned off with the output Q indicating high level output in synchronization with the clock CLK input to the latch circuit 153. Consequently, the current of the constant current source I1 is supplied to the output "out b".

As explained above with the D/A converter 100 in which the equal currents cells 150 are each provided with the latch circuit 153 that causes the PMOS's Q1 and Q2 to switch the current from the constant current source I1 to be supplied to either the output "out" or the output "out b", glitches can be completely eliminated from the signals provided at the gates of the PMOS's Q1 and Q2 by taking into consideration of the delays at the row decoder 110 and the column decoder 120 and the timing of the clock CLK, to improve the S/N ratio.

In addition since no NMOS capacitance is required, another advantage is achieved in that a reduction in power consumption is realized. Furthermore, since a latch circuit that inputs a synchronized signal is employed to constitute the storage circuit, the number of gates can be reduced compared to that required in a structure employing flip-flops.

Second Embodiment

Figure 3:
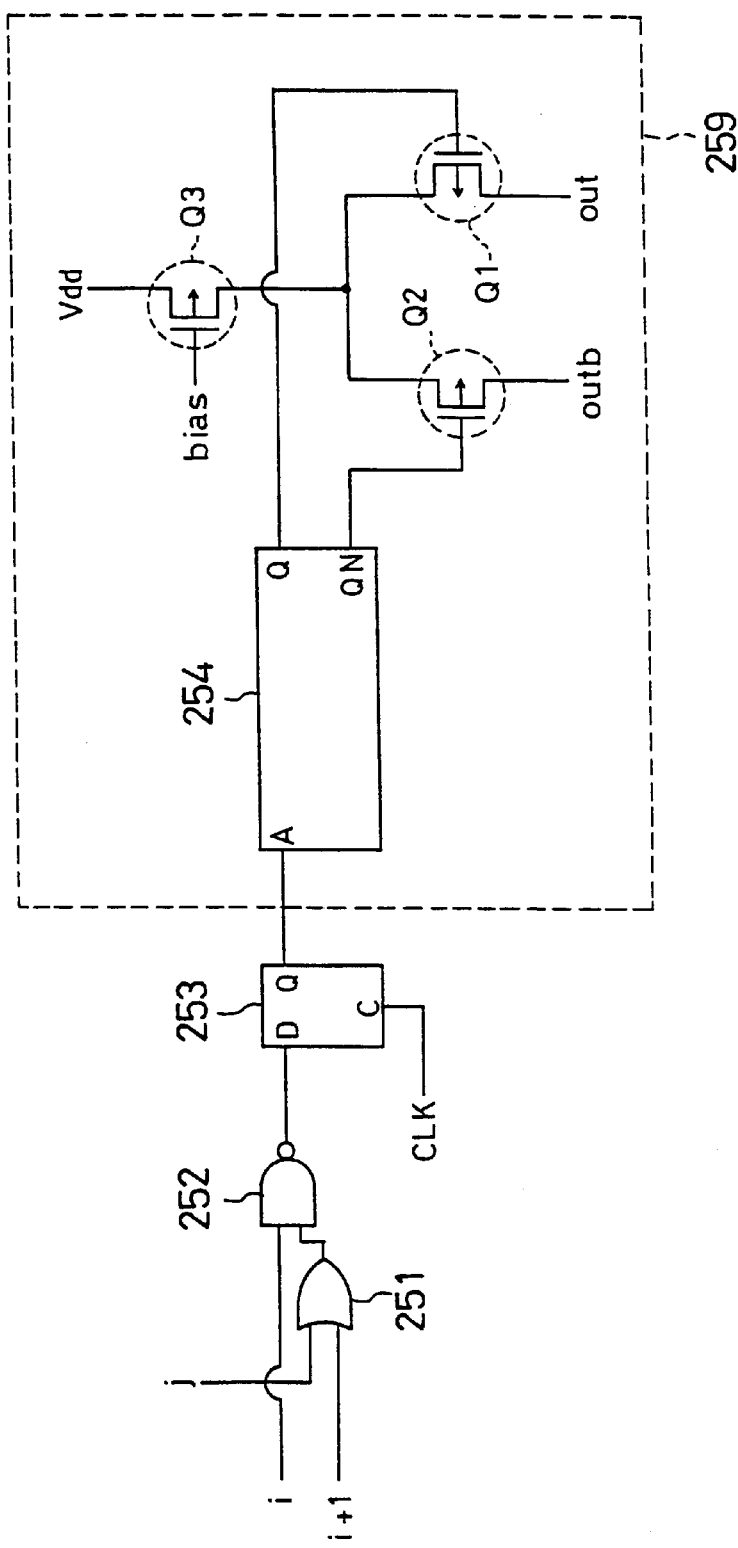
FIG. 3 illustrates the structure of the equal current cells in a second embodiment of the present invention.
Figure 4:
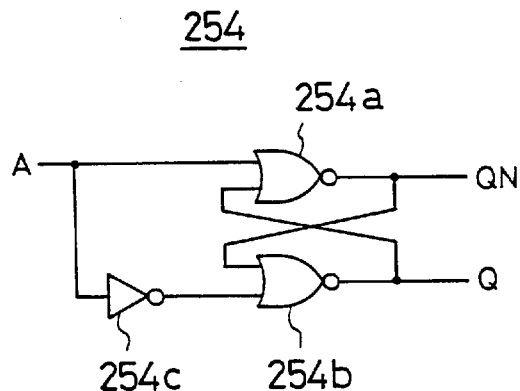
FIG. 4 illustrates the structure of the waveform shaping circuit employed in the equal current cell in FIG. 3.

A D/A converter 200 in the second embodiment is now explained in reference to FIGS. 3 and 4. As in the case of the D/A converter 100 in the first embodiment illustrated in FIG. 1, the D/A converter 200 comprises equal current cell circuits 250 arrayed in a matrix, a row decoder that makes selections in the direction of the rows of the equal current cell circuits 250 and a column decoder that makes selections in the direction of the columns of the equal current cell circuits 250. It is to be noted that since all the components of the D/A converter 200 except for the equal current cells 250 are structured essentially identical to the corresponding components of the D/A converter 100, their explanation is omitted.

The equal current cells 250, which are arrayed in an 8×8 matrix, are connected to the row decoder and the column decoder (not shown), and, as illustrated in FIG. 3, inputs i and i+1 connected to the row decoder and an input j connected to the column decoder are input to them. The equal current cells 250 each comprise a two-input OR element 251 into which the inputs i+1 and j are input, a two-input NAND element 252 into which the output of the two-input OR element 251 and the input i are input, a latch circuit 253 into which the output of the two-input NAND element 252 and a clock CLK are input and a current switch portion 259. It is to be noted that since all the components of each equal current cell 250 except for the current switch portion 259 are essentially identical to the corresponding components of the equal current cell 150 in the first embodiment in their structures and connections, their explanation is omitted.

An output Q of the latch circuit 253 is input to the current switch portion 259. The current switch portion 259 includes of a waveform shaping circuit 254 and PMOS's Q1, Q2 and Q3. The output Q of the latch circuit 253 is input to an input A of the waveform shaping circuit 254. The output Q of the waveform shaping circuit 254 is connected to the gate terminal of the PMOS Q1. An output QN of the waveform shaping circuit 254 is connected to the gate terminal of the PMOS Q2. As detailed later, the logic level of the output QN of the waveform shaping circuit 254 is achieved by inverting the logic level of the output Q.

The PMOS Q3 with a bias voltage applied to its gate terminal is set in a drain saturation region to function as a constant current source I1. A source terminal of the PMOS Q3 is connected to a source Vdd and a drain terminal of the PMOS Q3 is connected to the source terminals of the PMOS's Q1 and Q2. A drain terminal of the PMOS Q1 is connected to the output "out" whereas a drain terminal of the PMOS Q2 is connected to the output "out b". The outputs "out" and "out b" are both wired throughout the matrix.

As illustrated in FIG. 4, the waveform shaping circuit 254 includes of two-input NOR elements 254a and 254b constituting an S-R latch circuit and an inverter element 254c. The input A is input to one input of the two-input NOR element 254a and is also input to one input of the two-input NOR element 254b via the inverter element 254c. The output of the two-input NOR element 254a is connected to the output QN and is also input to another input of the two-input NOR element 254b. Likewise, the output of the two-input NOR element 254b is connected to the output Q and is also input to another input of the two-input NOR element 254a.

By adopting the structure described above for the waveform shaping circuit 254, the output Q is set to high level and the output QN is set to low level when the input A is at high level. In addition, when the input A is at low level, the output Q is set to low level and the output QN is set to high level. Furthermore, when the input A shifts, the potential at which the waveforms of the outputs Q and QN cross each other at almost equal levels at the rise and the fall of the input A, so that current flows to both the PMOS's Q1 and Q2.

The following is an explanation of the operation of the D/A converter 200 structured as described above. Since the operations performed by the components other than the current switch portions 259 are essentially identical to the operations performed by the corresponding components in the D/A converter 100 in the first embodiment, their explanation is omitted.

When the input A of the waveform shaping circuit 254 shifts, the outputs Q and QN cross each other in a state in which the PMOS's Q1 and Q2 are supplied with current. At this point, the sum of the current supplied to the PMOS Q1 and the current supplied to the PMOS Q2 should achieve a level approximately equal to that of the current from the constant current source in a normal state. Even if both the PMOS's Q1 and Q2 are turned on to reduce the drain voltage at the PMOS Q3, the current supplied to the output out is low, to have only a small noise effect. When both the PMOS's Q1 and Q2 are turned off, the drain voltage at the PMOS Q3 increases, and when the PMOS Q1 next enters an on state, the source-drain voltage at the PMOS Q1 increases the current supplied to the output out to a level higher than that of the constant current, resulting in a large noise effect.

When the input A is at low level, the output QN is at high level, as explained earlier. When the input A rises to high level, the output QN is set to low level. At the same time, the output of the inverter 254c is set to low level, and then the output Q is set to high level.

When the input A falls to low level, on the other hand, the output QN remains unchanged at low level since the output Q is still at high level. However, the output of the inverter 254c is set to high level, and then the output Q is set to low level. Then, the output QN is set to high level. In other words, since either of the outputs Q and QN rises only after the other output falls, the potential at which the waveforms of the gate inputs at the PMOS's Q1 and Q2 cross each other can be set at a low level to achieve a state in which they are both turned on. Consequently, since a state in which either the PMOS Q1 or the PMOS Q2 is on can be sustained, it becomes possible to realize a D/A converter having a good S/N ratio.

As has been explained, with the D/A converter 200 in which the waveform shaping circuit 254 is employed to set the potential at which the output waveforms cross each other to ensure that the PMOS's Q1 and Q2 constituting the current switch are both supplied with current, an improvement in the S/N ratio is achieved.

Furthermore, since the waveform shaping circuit 254 utilizes an inverter and an S-R latch circuit to ensure that either the output Q or the output QN rises only after the other output falls, the potential at which their output waveforms cross each other achieves almost equal levels at the rise and the fall of the input waveform and the crossing potential can be set simply by adjusting the delays at the individual gates to facilitate circuit design.

Third Embodiment

Figure 5:
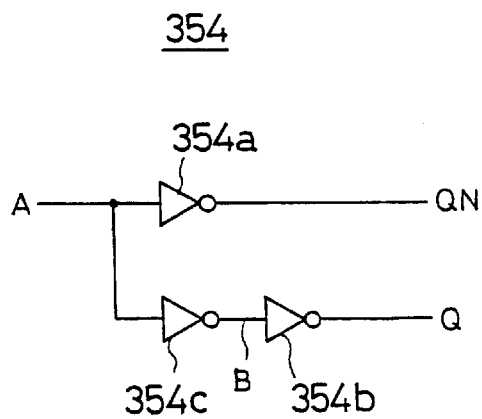
FIG. 5 illustrates the structure of the waveform shaping circuits in a third embodiment of the present invention.
Figure 6:
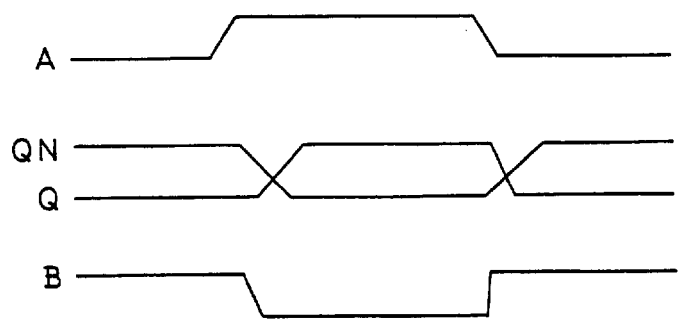
FIG. 6 is a timing chart of the waveform shaping circuits illustrated in FIG. 5.

A D/A converter 300 in the third embodiment is now explained in reference to FIGS. 5 and 6. As in the case of the D/A converter 200 in the second embodiment illustrated in FIG. 3, the D/A converter 300 comprises equal current cell circuits 350 arrayed in a matrix, a row decoder that makes selection in the direction of the rows of the equal current cell circuits 350 and a column decoder that makes selection in the direction of the columns of the equal current cell circuits 350. Since all of the components of the D/A converter 300 except for a waveform shaping circuit 354 provided within each equal current cell circuit 350 are essentially identical to the structures of the corresponding components of the D/A converter 200, their explanation is omitted.

As illustrated in FIG. 5, the waveform shaping circuit 354 includes inverter elements 354a, 354b and 354c. An input A is connected to an output QN via the inverter element 354a and is also connected to an output Q via the inverter elements 354b and 354c. The dimensions of the transistors are set to ensure that the rise of the inverter 354a is slow, that the inverter 354b operates at high speed with a small length of delay and that the inverter 354c rises slowly but falls rapidly.

Now, the operation of the D/A converter 300 structured as described above is explained in reference to the time chart in FIG. 6.

First, when the input A rises to high level, the output QN slowly falls to low level via the inverter element 354a. At the same time, the output B of the inverter element 354b rapidly falls to low level and the output Q of the inverter 354c slowly rises to high level. Consequently, by offsetting the timing with which the output Q rises and the timing with which the output QN falls, the potential at which the waveform of the outputs Q and QN cross each other can be set at a low level.

Next, when the input A rises to high level, the output QN rapidly falls to low level via the inverter element 354a. At the same time, the output B of the inverter element 354b rapidly rises to high level and the output Q of the inverter element 354c rapidly falls to low level. As a result, by offsetting the fall of the output Q and the rise of the output QN, the potential at which the waveforms of the outputs Q and QN cross each other can be set at a low level.

By adopting the waveform shaping circuits 354 each structured as described above, since the state in which either the PMOS Q1 or the PMOS Q2 remains on can be sustained, a D/A converter having a better S/N ratio can be achieved.

As has been explained, with the D/A converter 300, in which three inverter elements achieving different characteristics are employed to set the potential at which the output waveforms cross each other to ensure that the PMOS's Q1 and Q2 constituting the current switch are both supplied with current, an advantage is achieved in that an improvement in the S/N ratio is realized as in the D/A converter 200 in the second embodiment.

In addition, since the waveform shaping circuits each include three inverters to achieve a structure having a smaller number of gates, it is possible to reduce the chip area.

While the invention has been particularly shown and described with respect to preferred embodiments of the semiconductor integrated circuit of the present invention by referring to the attached drawings, the present invention is not limited to these examples and it will be understood by those skilled in the art that various changes in form and detail may be made therein without departing from the spirit, scope and teaching of the invention.

For instance, while an example in which the present invention is adopted in a D/A converter are explained in reference to the first, second and third embodiments, the present invention may be adopted in an analog/digital converter circuit that performs digital/analog conversion.

Only the basic structure has been explained in reference to the first, second and third embodiments, and in order to adjust the length of transmission delay, a delay element may be inserted in the transmission path of the selection signal for the current switch. In addition, the latch circuit included in the equal current cell to achieve synchronization may constituted of a flip-flop or the like.

In addition, the current switch may be constituted of three or more transistors and the waveform shaping circuit may be structured to ensure that a current supply is sustained for at least one transistor.

As has been explained, according to the present invention, the following outstanding advantages are achieved.

According to the present invention, glitches can be completely eliminated from signals provided to the current switch portions to achieve an improvement in the S/N ratio. Also, since no NMOS capacitance is required, an advantage is achieved in that a reduction in power consumption is realized.

Furthermore, since a latch circuit into which a synchronization signal is input, is employed to constitute the storage circuit, the number of gates can be reduced compared to that in a structure employing flip-flops.

Moreover, with the potential at which the output waveforms cross each other set to ensure that the PMOS'S constituting the current switch are supplied with current by employing the waveform shaping circuit, an improvement in the S/N ratio is achieved.

In addition, since the waveform shaping circuit is structured to ensure that either of its outputs rises only after the other falls by employing the inverter and the S-R latch circuit, the potential at which the output waveforms cross each other achieves almost equal levels at the rise and the fall of the input waveform, and the crossing potential can be set by adjusting the delay times at the individual gates to facilitate design.

Moreover, since one inverter and two inverters are employed to set the potential at which the output waveforms cross each other to ensure that the PMOS's constituting the current switch portion are supplied with current, an advantage is achieved in that the S/N ratio is improved, as in the second embodiment. In addition, since the waveform shaping circuit is constituted of three inverters, a structure is achieved with an even smaller number of gates to reduce the chip area.

The entire disclosure of Japanese Patent Application No. 10-231755 filed of Aug. 18, 1998 including specification, claims, drawings and summary is incorporated herein by reference in its entirety.

What is claimed is:

1. A semiconductor integrated circuit, comprising:
   a current cell array having current cells, each of which includes first and second PMOS transistors and a current source coupled to said first and second PMOS transistors, said first and second PMOS transistors entering an ON state in response to first and second switching signals;
   a first decoder circuit that outputs a first selection signal to select a specific number of current cells;
   a second decoder circuit that outputs a second selection signal to select a specific number of current cells;
   a plurality of logic circuits, each receiving the first and second selection signals and outputting a third selection signal; and
   a plurality of storage circuits, each receiving said third selection signal and outputting said first and second switching signals to said first and second PMOS transistors in synchronism with a control signal.

2. A semiconductor integrated circuit according to claim 1, wherein each of said storage circuits includes a latch circuit that outputs a signal in synchronism with a clock signal.

3. A semiconductor integrated circuit according to claim 2, wherein each of said current cells includes a waveform shaping circuit that shapes a potential waveform of said first and second switching signals output from each of said storage circuits.

4. A semiconductor integrated circuit according to claim 3, wherein said waveform shaping circuit includes an S-R latch circuit that has a two-input NOR element.

5. A semiconductor integrated circuit according to claim 3, wherein said waveform shaping circuit includes a plurality of inverter elements having different threshold voltage values.

6. A semiconductor integrated circuit according to claim 5, wherein said plurality of inverter elements consists of three inverter elements.

7. A semiconductor integrated circuit according to claim 1, wherein said semiconductor integrated circuit further includes two or more inverters and output signals from said storage circuit are provided to gates of said first and second PMOS transistors through said inverters.

8. A semiconductor integrated circuit, comprising:

a current cell array having current cells each including first, and second PMOS Transistors and a current source coupled to said first and second PMOS transistors;

a first decoder circuit that selects, in a direction of rows in said current cells array, a specific number of equal current cells; and a second decoder circuit that selects, in a direction of columns in said current cell array, a specific number of equal current cells;

wherein each of said equal current cells includes a storage circuit that synchronizes an output signal from said first decoder and an output signal from said second decoder and outputs a specific output signal to said first and second PMOS transistors, and a waveform shaping circuit that shapes a potential waveform of said output signal outputs from said storage circuit.

9. A semiconductor Integrated circuit according to claim 7, wherein said waveform shaping circuit includes an S-R latch circuit having a two-input NOR element.

10. A semiconductor integrated circuit according to claim 8, wherein said waveform shaping circuit includes two or more inverters and output signals from said storage circuit are provided to gates of said first and second PMOS transistors through said inverters.

11. A semiconductor integrated circuit according to claim 7, wherein said waveform shaping circuit includes a plurality on inverter elements having different threshold voltage values.

12. A semiconductor integrated circuit according to claim 9, wherein said plurality of inverter elements is constituted by three inverter elements.

* * * * *